US008757401B2

(12) United States Patent
Uchino

(10) Patent No.: US 8,757,401 B2
(45) Date of Patent: Jun. 24, 2014

(54) ARTICLE TRANSPORT DEVICE

(75) Inventor: Kiichi Uchino, Okegawa (JP)

(73) Assignee: Daifuku Co., Ltd., Osaka (JP)

( * ) Notice: Subject to any disclaimer, the term of this patent is extended or adjusted under 35 U.S.C. 154(b) by 96 days.

(21) Appl. No.: 13/251,391

(22) Filed: Oct. 3, 2011

(65) Prior Publication Data

US 2012/0080396 A1 Apr. 5, 2012

(30) Foreign Application Priority Data

Oct. 4, 2010 (JP) ................................ 2010-224890

(51) Int. Cl.
*B66C 21/00* (2006.01)

(52) U.S. Cl.
USPC ................................ 212/77; 212/331; 212/98

(58) Field of Classification Search
USPC ............... 212/76, 77, 83, 86, 87, 97, 98, 122, 212/328, 331, 338, 343, 345
See application file for complete search history.

(56) References Cited

U.S. PATENT DOCUMENTS

| | | | | | |
|---|---|---|---|---|---|
| 840,807 | A | * | 1/1907 | Shem | 414/673 |
| 1,375,908 | A | * | 4/1921 | Hescock | 212/285 |
| 1,487,032 | A | * | 3/1924 | Shutt | 164/405 |
| 1,922,176 | A | * | 8/1933 | Ruhland | 212/93 |
| 3,345,471 | A | * | 10/1967 | Kilburg | 191/45 R |
| 4,735,539 | A | * | 4/1988 | Hakkinen et al. | 414/281 |
| 4,754,886 | A | * | 7/1988 | Hirano | 212/76 |
| 5,136,938 | A | * | 8/1992 | Pellegrina | 101/115 |
| 5,165,556 | A | * | 11/1992 | Karhunen | 212/319 |
| 5,454,328 | A | * | 10/1995 | Matsuzaki et al. | 104/139 |
| 5,495,955 | A | * | 3/1996 | Shibata | 212/275 |
| 5,738,482 | A | * | 4/1998 | Piazza | 414/752.1 |
| 6,183,184 | B1 | * | 2/2001 | Shiwaku | 414/281 |
| 6,324,989 | B1 | * | 12/2001 | Taylor et al. | 104/93 |
| 7,210,589 | B2 | * | 5/2007 | Iizuka | 212/273 |
| 7,234,605 | B1 | * | 6/2007 | Torgerson | 212/84 |
| 7,328,812 | B2 | * | 2/2008 | Nakao et al. | 212/330 |
| 7,578,240 | B2 | * | 8/2009 | Shiwaku | 104/89 |
| 7,796,049 | B2 | * | 9/2010 | Ito | 340/673 |
| 2004/0109746 | A1 | * | 6/2004 | Suzuki | 414/373 |
| 2004/0253087 | A1 | * | 12/2004 | Iizuka | 414/626 |

(Continued)

FOREIGN PATENT DOCUMENTS

| | | |
|---|---|---|
| JP | 62108383 U | 7/1987 |
| JP | 10201691 A | 8/1998 |

(Continued)

*Primary Examiner* — Emmanuel M Marcello
*Assistant Examiner* — Michael Gallion
(74) *Attorney, Agent, or Firm* — The Webb Law Firm

(57) ABSTRACT

An article transport device having a housing space for housing an article retained by an article-retaining unit located in a raised position, is formed in a moving body of the article transport device, and an aperture for allowing the article-retaining unit to be raised and lowered between the raised position and a lowered position, is formed in the lower-end part of the housing space. The article transport device further comprising purified air ventilation means for ventilating purified air through an air purification filter, an opening/closing element capable of changing positions to an open position for opening the aperture and a closed position for blocking the aperture by pivoting around a lateral axis, and opening and closing control means for positioning the opening/closing element in the open position in a case in which the article-retaining unit is raised or lowered between the raised position and the lowered position.

17 Claims, 4 Drawing Sheets

(56) References Cited

U.S. PATENT DOCUMENTS

| | | | |
|---|---|---|---|
| 2005/0279064 A1* | 12/2005 | Simmons | 55/495 |
| 2006/0051192 A1* | 3/2006 | Fujiki | 414/626 |
| 2006/0182553 A1* | 8/2006 | Yamamoto et al. | 414/278 |
| 2006/0237525 A1* | 10/2006 | Sone | 235/375 |
| 2006/0245862 A1* | 11/2006 | Hansl et al. | 414/281 |
| 2007/0059131 A1* | 3/2007 | Yoshitaka | 414/217 |
| 2007/0157878 A1* | 7/2007 | Aoki et al. | 118/500 |
| 2008/0168920 A1 | 7/2008 | Nakashima et al. | |
| 2008/0219825 A1* | 9/2008 | Yoshida et al. | 414/749.6 |
| 2009/0001040 A1* | 1/2009 | Kleiss et al. | 212/242 |
| 2009/0016864 A1* | 1/2009 | Yoshida et al. | 414/276 |
| 2009/0202332 A1* | 8/2009 | Trebbi et al. | 414/788 |

FOREIGN PATENT DOCUMENTS

| | | |
|---|---|---|
| JP | 10218318 A | 8/1998 |
| JP | 10339071 A | 12/1998 |
| JP | 11208465 A | 8/1999 |
| JP | 11238787 A | 8/1999 |
| JP | 3226017 B2 | 11/2001 |
| JP | 2003264219 A | 9/2003 |
| JP | 2007227760 A | 9/2007 |
| JP | 2008169005 A | 7/2008 |

\* cited by examiner

ARTICLE TRANSPORT DEVICE

BACKGROUND OF THE INVENTION

1. Field of the Invention

The present invention relates to an article transport device in which an article-retaining unit capable of retaining an article is provided to a moving body capable of moving along a guide rail on a ceiling, so as to be able to be raised and lowered to a raised position located close to the moving body and to a lowered position downward from the raised position, a housing space for housing an article retained by the article-retaining unit located at the raised position is formed on the moving body, an aperture for allowing the article-retaining unit to be raised and lowered between the raised position and the lowered position is formed in the lower-end region of the housing space, and purified air ventilation means for ventilating purified air in the housing space through an air purification filter is provided.

2. Description of the Related Art

In a case in which the article transport device described above transports an article from a transport-origin article transport point to a transport-destination article transport point, first, the moving body moves to a stop position corresponding to the transport-origin article transport point and lowers the article-retaining unit from the raised position to the lowered position, and the article-retaining unit located at the lowered position receives the article from the article transport point. Thereafter, the article transport device raises the article-retaining unit from the lowered position to the raised position and, while the article is retained by the article-retaining unit located at the raised position, the moving body moves to a stop position corresponding to the transport-destination article transport point and lowers the article-retaining unit from the raised position to the lowered position, and the article-retaining unit located at the lowered position hands off the article at the transport-destination article transport point.

The article transport device thus transports articles among a plurality of article transport points by using the moving body to move from position to position and by raising and lowering the article-retaining unit. Such an article transport device is used to transport an article among a plurality of article transport points in, for example, a cleanroom, the article transport points being article processing units for carrying out various processes on the article. Accordingly, there is a desire to maintain clean conditions for the article during the transport thereof as well.

In view of this, in a conventional article transport device, a housing space for covering the periphery of an article retained by an article-retaining unit located at the raised position is formed on the moving body, and purified air ventilation means for ventilating purified air in this housing space through an air purification filter is provided (for example, see JP-B 3226017). Purified air is thereby ventilated to the article housed in the housing space when the article-retaining unit is located in the raised position and the moving body is used for movement, and the article being transported is kept in clean conditions.

In the above-described device recited in JP-B 3226017, the housing space is formed in a rectangular shape, and a clean unit having an air-blowing fan and an air filter through which the airflow generated by this air-blowing fan passes is provided as the purified air ventilation means. The clean unit is disposed such that the clean airflow that has passed through the air filter blows out into the housing space from substantially the entire area of one lateral surface of the housing space (a lateral surface on the front side of the moving body in the direction of travel). To supply a clean airflow to the entire article inside the housing space, the housing space is provided with a flow-regulating plate for guiding the clean airflow to the surface opposite from the clean unit, and the surface in the housing space opposite facing the clean unit is provided with a plurality of fins for regulating the flow direction of the clean airflow, spaced out at intervals in the up-down direction.

In an article transport device as described above, raising and lowering the article-retaining unit between the raised position and the lowered position allows articles to be exchanged (i.e., received and delivered) between the article-retaining unit and an article transport point such as an article processing unit. Therefore, an aperture for allowing the article-retaining unit to be raised and lowered between the raised position and the lowered position is formed in the lower-end part of the housing space. Dust therefore sometimes infiltrates into the housing space from outside the housing space through the aperture, and this dust sometimes adheres to the article housed in the housing space.

In view of this, in the above-described device according to JP-B 3226017, dust is prevented from infiltrating into the housing space from outside the housing space through the aperture by providing the plurality of fins for regulating the flow direction of the clean airflow and forming an air curtain for shielding the aperture. However, for example, the occurrence of even slight disturbance to the airflow may allow dust to infiltrate into the housing space through the aperture, which is a concern. It is therefore difficult to prevent dust from infiltrating into the housing space through the aperture merely by forming the air curtain.

In a case in which the article to be transported is, for example, a reticle cassette that houses a reticle for the lithographic exposure of semiconductors, liquid crystal display panels, or the like, a substance such as ammonia or sulfur dioxide may infiltrate into the housing space through the aperture and this substance adheres to the reticle cassette, creating a possibility that a cloudiness termed "haze" will occur in the reticle (that is, the reticle will become opaque), and the quality of the reticle will be adversely affected. In view of this, there is a need to prevent a substance such as ammonia or sulfur dioxide from adhering to the reticle cassette, but because an air curtain is merely formed in the above-described device recited in JP-B 3226017, it is difficult to prevent a substance such as ammonia or sulfur dioxide from infiltrating into the housing space from aperture.

The following is an additional description regarding the occurrence of haze (cloudiness) when a substance such as ammonia or sulfur dioxide adheres to a reticle cassette.

The reticle cassette serving as the article to be transported comprises, for example, a cassette body and a lid body that can be mounted onto the cassette body and can be removed from the cassette body. Further, for example, with a reticle being supported on the backside of the lid body and the lid body being mounted onto the cassette body, the reticle is housed in an enclosed space formed within the reticle cassette, and the reticle is kept in clean conditions. The reticle is used to perform lithographic exposure and other processes at the article processing unit serving as the article transport point. Therefore, the reticle is exchanged between the article processing unit and the article-retaining unit lowered to the lowered position. In this exchange of the reticle, it is not that the reticle itself is exchanged, but rather that the part of the reticle cassette supporting the reticle, such as the lid body, is exchanged as a unit. Accordingly, a part of the reticle cassette is transported to the article processing unit. Therefore, ammonia, sulfur dioxide, or the like in the air adheres to this single part of the reticle cassette, whereupon light energy is applied when lithographic exposure or another process is performed, and the ammonia, sulfur dioxide, or the like initiates a chemical reaction, generating ammonium dioxide or other haze-causing substances. Haze thus occurs when a substance such as ammonia or sulfur dioxide adheres to the reticle cassette.

SUMMARY OF THE INVENTION

The present invention has been made with an emphasis on these points, and an object thereof is to resolve or mitigate at least one of the problems in the prior art.

In order to achieve this object, the article transport device according to the present invention is provided with the following:

a moving body configured to move along a guide rail on a ceiling;

an article-retaining unit provided to the moving body, configured so as to be raised and lowered to a raised position located close to the moving body and to a lowered position downward from the raised position, and configured so as to retain an article;

a housing space for housing an article retained by the article-retaining unit located at the raised position being formed in the moving body, and an aperture for allowing the article-retaining unit to be raised and lowered between the raised position and the lowered position being formed in a lower-end part region of the housing space;

purified air ventilation means for ventilating purified air in the housing space through an air purification filter;

an opening/closing element configured to change positions to an open position for opening the aperture and a closed position for blocking the aperture by pivoting around a horizontal axis; and opening and closing control means for positioning the opening/closing element at the open position in a case in which the article-retaining unit is to be raised and lowered between the raised position and the lowered position, and changing the position of the opening/closing element from the open position to the closed position when the raising and lowering of the article-retaining unit between the raised position and the lowered position is completed.

According to such a configuration, positioning the opening/closing element in the closed position makes it possible to make the housing into a substantially enclosed space, to ventilate purified air in the housing space serving as this enclosed space by using the purified air ventilation means, and to fill the housing space with purified air. By filling the housing space with purified air in this manner, not only can dust be prevented from adhering to the article being housed in the housing space, but ammonia, sulfur dioxide, and other substances can also be prevented from adhering.

Further, the opening and closing control means positions the opening/closing element at the open position in a case in which the article-retaining unit is to be raised and lowered between the raised position and the lowered position, and changes the position of the opening/closing element from the open position to the closed position when the raising and lowering of the article-retaining unit between the raised position and the lowered position is complete. Therefore, it is possible to have the aperture open only in a case in which the article-retaining unit is to be raised or lowered and to have the aperture blocked by a blocking body in all other cases. The housing space can thereby be filled with purified air at times other than when the article-retaining unit is to be raised or lowered, such as during movement by the moving body with the article-retaining unit located in the raised position, thus not only preventing dust from adhering to the article, but also preventing ammonia, sulfur dioxide, and other substances from adhering.

Because changing the position of the opening/closing element between the open position and the closed position is performed by pivoting around a horizontal axis, the occurrence of dust itself can be prevented and, if produced, the dust can be appropriately prevented from adhering to an article being transported, while a configuration is provided that is simpler than, for example, one based on a sliding movement.

The article transport device according to the present invention can also be provided with the following:

a moving body configured so as to move along a guide rail suspended from a ceiling, the moving body having a front wall, a rear wall, a top wall, and a pair of lateral walls spaced apart in the lateral direction;

an article-retaining unit provided to the moving body, configured so as to be raised and lowered between a raised position located close to the moving body and a lowered position downward from the raised position, and configured so as to retain an article, the article-retaining unit at the raised position being housed within a housing space formed by at least the front wall, rear wall, top wall, and pair of lateral walls of the moving body, and the housing space communicating with the outside of the moving body via an aperture formed in a bottom region of the moving body;

a fan provided to at least one of the front wall, rear wall, top wall, and pair of lateral walls of the moving body, and a filter disposed so as to purify air from the fan; and at least one door configured so as to change position between an open position for opening the aperture and a closed position for blocking the aperture, and provided to the bottom region of the moving body, the housing space being substantially closed in all directions when the at least one door is in the closed position.

DESCRIPTION OF THE PREFERRED EMBODIMENTS

An embodiment of an article transport facility in which the article transport device according to the present invention is adopted will be described on the basis of the diagrams.

Figure 1:
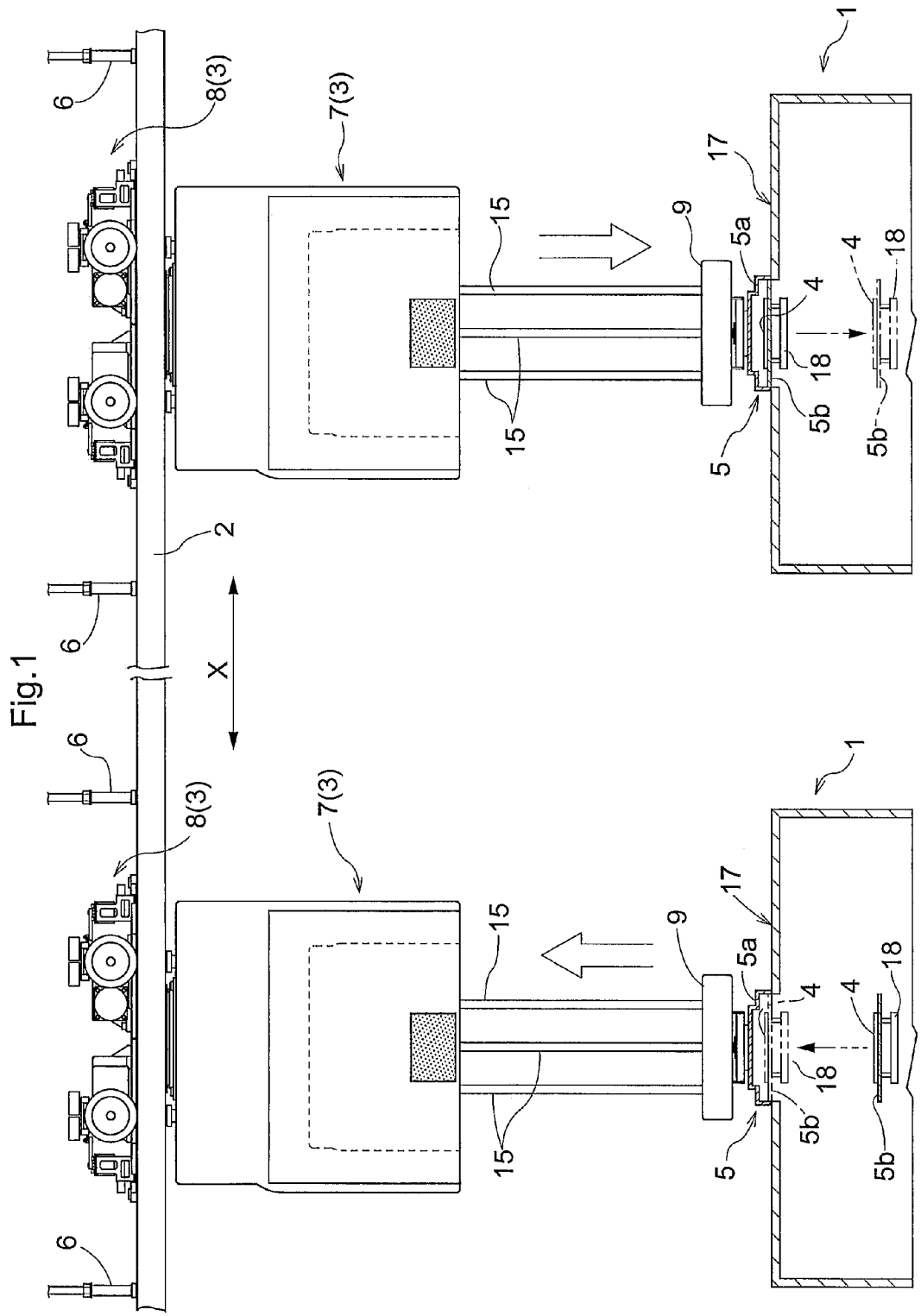
FIG. 1 is a schematic view of an article transport facility in which the article transport device according to the present invention is adopted.
Figure 2:
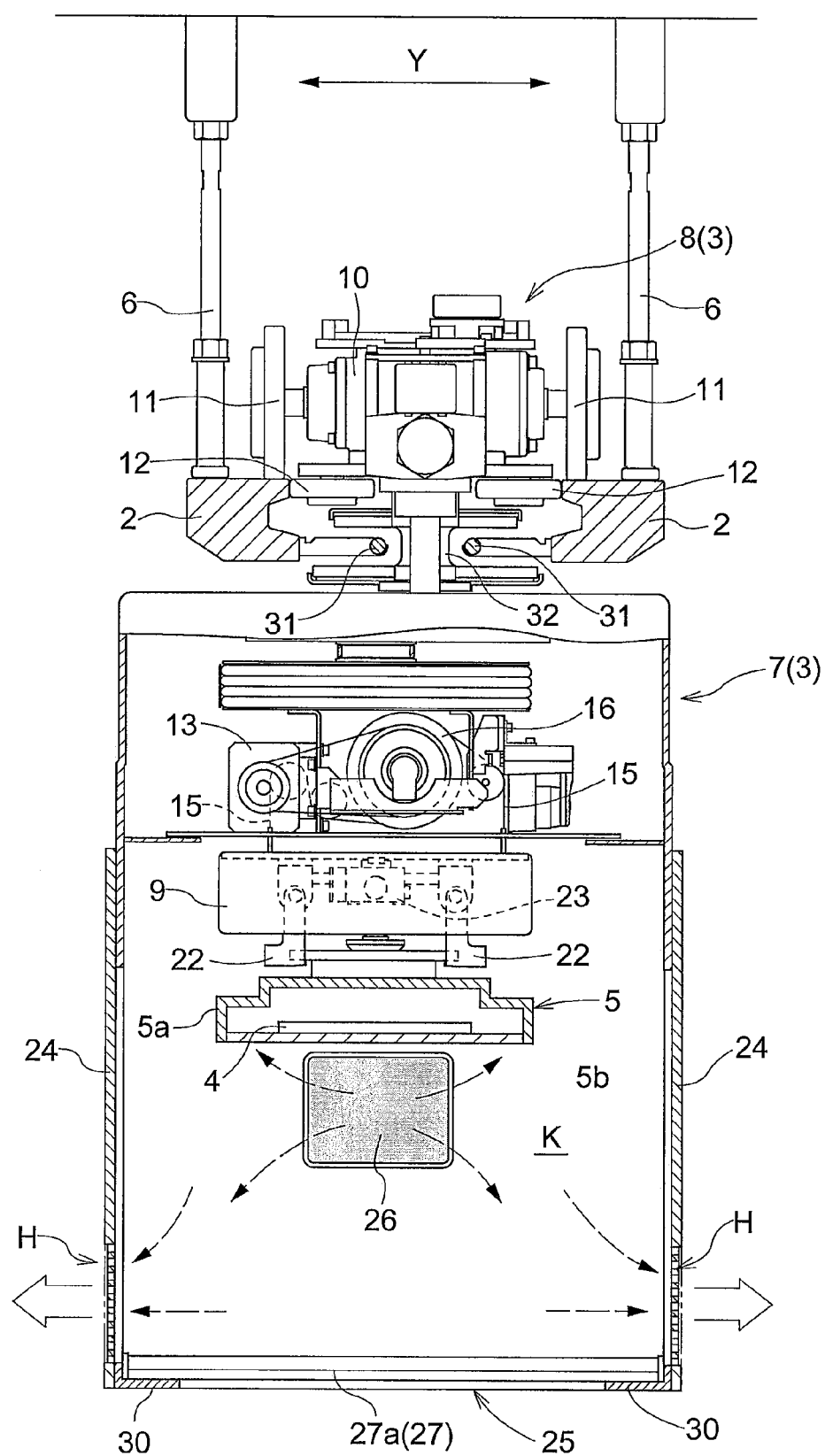
FIG. 2 is a front view of an article transport vehicle when viewed along the front-rear direction of the article transport vehicle.
Figure 3:
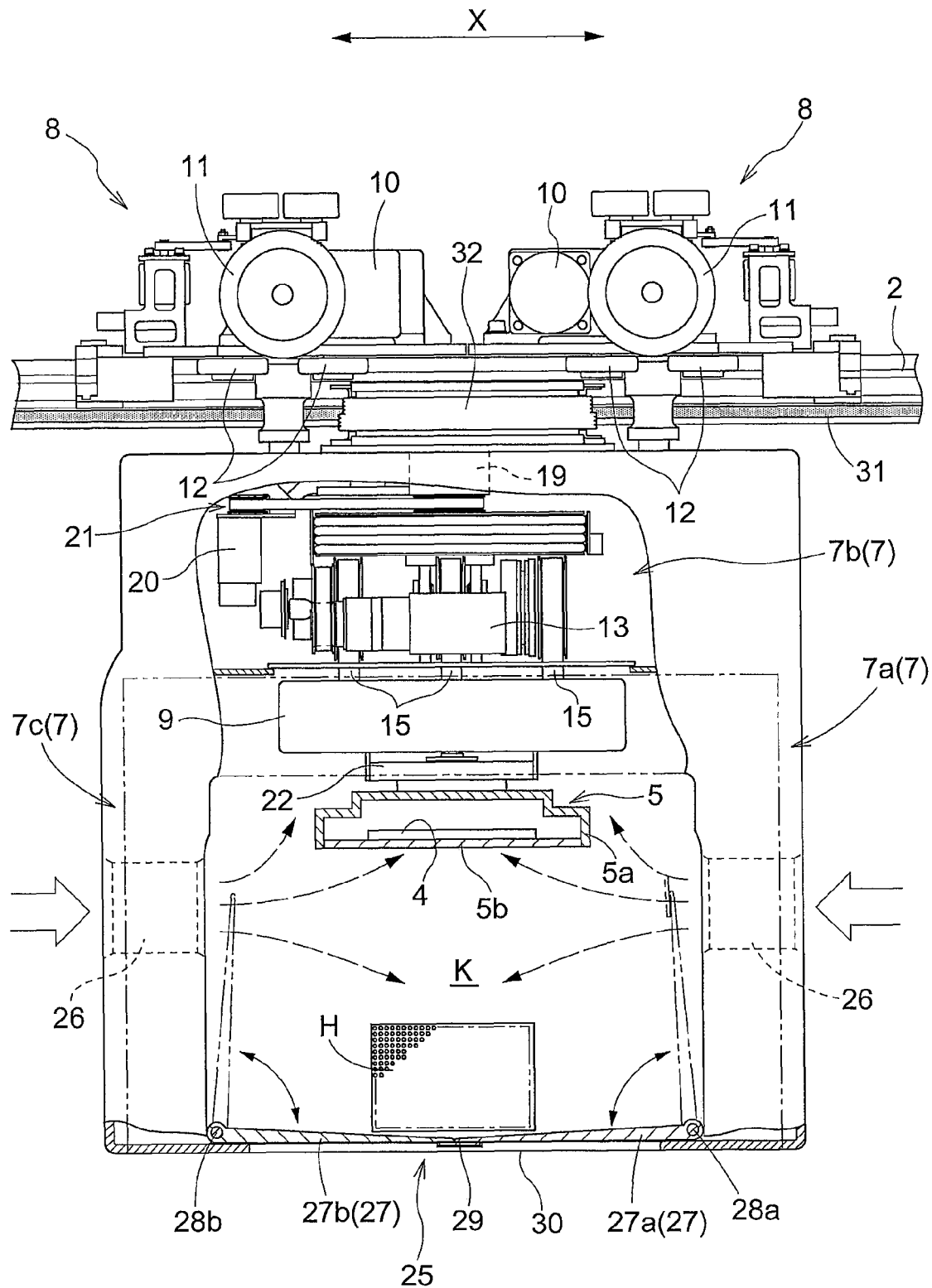
FIG. 3 is a side view of an article transport vehicle when viewed along the lateral width direction of the article transport vehicle.

In this article transport facility, as depicted in FIGS. 1 to 3, a guide rail 2 is installed on a ceiling in a state of extending by way of or adjacent to a plurality of article processing units 1, and an article transport vehicle 3 (the article transport device according to the present invention) for ceiling transport capable of moving in one direction along the guide rail 2 is provided. The guide rail 2 is installed in state of being fixed to a ceiling unit by a guide rail bracket 6. The article processing units 1 are configured so as to perform a variety of processes, and the article transport vehicle 3 is configured so as to be able to transport an article (reticle cassette 5) among the plurality of article processing units 1.

Herein, FIG. 1 is a schematic view of an article transport facility depicting the exchange (i.e., receipt and delivery) of an article between the article transport vehicle 3 and an article processing unit 1. One side of FIG. 1 depicts a case in which the article transport vehicle 3 receives the reticle cassette 5 from the article processing unit 1, and the other side of FIG. 1 depicts the case in which the article transport vehicle 3 delivers the reticle cassette 5 to the article processing unit 1. FIG. 2 is a front view of the article transport vehicle 3 when viewed along the front-rear direction of the article transport vehicle 3 (the X direction in FIG. 1), and FIG. 3 is a side view of the article transport vehicle 3 when viewed along the lateral width direction of the article transport vehicle 3 (the Y direction in FIG. 2).

In this article transport facility, as depicted in FIGS. 1 to 3, the article for transport that is transported on the article transport vehicle 3 is the reticle cassette 5, which is capable of housing a reticle 4 in the enclosed space within the cassette. Herein, the reticle 4 is intended to be used for lithographic exposure and other processes involving semiconductors, liquid crystal display panels, or the like in the article processing unit 1. The reticle cassette 5 is configured so as to be provided with a cylindrical cassette body 5a, the upper side of which is blocked and the lower side of which is open, and with a lid body 5b capable of blocking the opening on the lower side of this cassette body 5a. Further, an enclosed space is formed within the reticle cassette 5 by mounting the lid body 5b onto the cassette body 5a, and the reticle 4 is housed in the enclosed space within the reticle cassette 5 by, for example, supporting the reticle 4 on the back surface or the like of the lid body 5b.

As illustrated in FIG. 1, each processing unit 1 is provided with an article-transfer station 17 for exchanging the reticle cassette 5 with the article transport vehicle 3. The station 17 comprises a mounting unit on which the reticle cassette 5 can be mounted and supported, and the like. The station 17 is provided with a raisable and lowerable platform 18 capable of retaining a part of the reticle cassette 5 (for example, the lid body 5b) and also capable of being raised and lowered within the interior of the article processing unit 1 in a state in which this part of the reticle cassette 5 (for example, the lid body 5b) is retained.

As illustrated on one side of FIG. 1, in a case in which the reticle cassette 5 is mounted from the article transport vehicle 3 onto the station 17, for example, the lid body 5b supporting the reticle 4 is removed from the cassette body 5a by a lid body mounting and dismounting device (not shown), and the raisable and lowerable platform 18 is lowered in a state in which the removed lid body 5b is retained. The configuration is thereby such that the part of the reticle cassette 5 supporting the reticle 4 (for example, the lid body 5b) as a unit, rather than the reticle 4 by itself, is transported into the article processing unit 1.

As illustrated on the other side of FIG. 1, for example, when the process in the article processing unit 1 is completed, the raisable and lowerable platform 18 is raised from inside the article processing unit 1 to the station 17 in a state in which the lid body 5b supporting the reticle 4 is retained, and the lid body 5b is mounted onto the cassette body 5a by the lid body mounting and dismounting device (not shown).

The article transport vehicle 3, as illustrated in FIGS. 1 to 3, is provided with a vehicle main body 7 (corresponding to the moving body), travel units 8 for traveling on the guide rail 2, and a grip unit 9 for gripping the reticle cassette 5 in a suspended state (corresponding to the article-retaining unit). The travel units 8 are provided as a pair spaced out in the front-rear direction (which is the X direction in the diagram, and will hereinafter be called simply the front-rear direction X) of the article transport vehicle 3, at a position corresponding to the front end part of the vehicle main body 7 and at a position corresponding to the rear end part. The grip unit 9 is provided so as to be able to be raised and lowered relative to the vehicle main body 7. Hereinafter, expressions such as "front" and "rear" are meant to indicate directions relating to the directions of the route of the article transport vehicle 3.

Each of the pair of the front and rear travel units 8, as illustrated in FIGS. 2 and 3, is provided with travel wheels 11 that are rotatably driven by an electric drive motor 10 and roll on surfaces extending along the horizontal direction of each of the pair of left and right guide rails 2, and with freely rotatable guide wheels 12 that are in contact with the opposing lateral surfaces belonging to the pair of left and right guide rails 2 and extending in the up-down direction. One travel wheel 11 is disposed on each of the two end parts—in the lateral width direction (which is the Y direction in the diagram, and will hereinafter be called simply the lateral width direction Y) of the article transport vehicle 3. Two guide wheels 12 are each disposed at each of the two end parts of the lateral width direction Y, in a state lined up along the front-rear direction X. The travel wheels 11 are rotatably driven by the drive motor 10 around a horizontal axis, and the guide wheels 12, capable of rotating around an up-down axis, are in contact with the pair of guide rails 2 and are guided in the horizontal direction, whereby the travel unit 8 is configured so as to be guided and caused to travel on the guide rail 2.

The vehicle main body 7, as illustrated in FIG. 3, has a front-end portion 7a, an intermediate portion 7b, and a rear-end portion 7c, which are positioned in this order beginning from the front side of the article transport vehicle 3. The intermediate portion 7b is formed in a shape extending in the front-rear direction X; the front-end portion 7a is formed in a shape extending downward from the front end part of the intermediate portion 7b; and the rear-end portion 7c is formed in a shape extending downward from the rear end part of the intermediate portion 7b. The grip unit 9 is disposed between the front-end portion 7a and the rear-end portion 7c, and the intermediate portion 7b houses an electric hoisting motor 13 for raising and lowering the grip unit 9, and an electric swing motor 20 for swinging the grip unit 9 around the up-down axis.

The hoisting motor 13 is configured to be able to raise or lower the grip unit 9 to a raised position or a lowered position by rotating and driving a rotating drum 16 around which a belt 15 is wrapped so as to wind up or unreel the belt 15. Instead of the belt 15, it is also possible to use, for example, a wire. The raised position, as illustrated in FIGS. 1 to 3, is a position located close to the vehicle main body 7, the grip unit 9 being positioned at the raised position in a case in which the article transport vehicle 3 is to travel. The lowered position, as illustrated in FIG. 1, is a position for transferring an article with the article-transfer station 17 corresponding to each article processing unit 1 installed on the floor.

The grip unit 9, as illustrated in FIG. 3, is coupled so as to rotatable around an up-down axis relative the vehicle main body 7 by a swing axle 19 extending downward from the upper end part of the vehicle main body 7. The swing motor 20 is configured to be able to swing the grip unit 9 around the up-down axis by rotatably driving the swing axle 19 around an up-down axis via a rotary drive power transmission unit 21 having a pulley and belt.

The grip unit 9, as illustrated in FIGS. 2 and 3, is provided with grip tools 22 for gripping the reticle cassette 5, and with an electric gripping motor 23 for conducting an operation to switch the orientation of the grip tools 22 between a grip orientation for gripping the reticle cassette 5 and a grip-release orientation for releasing the grip thereof. FIGS. 2 and 3 depict the state in which the grip tools 22 have been switched to the grip orientation.

As illustrated in FIG. 2, a power-feeding wire 31 for feeding driving power to the article transport vehicle 3 is fixedly supported on each of the pair of left and right guide rails 2, and is disposed so as to extend along the guide rails 2. The vehicle main body 7 of the article transport vehicle 3 is provided with a power-receiving unit 32 (power-receiving coil) to which driving power from the power-feeding wire 31 is fed in a contactless manner. Further, the configuration is such that an alternating electric current is passed through the power-feeding wire 31 to generate a magnetic field, and the driving power is generated in the power-receiving unit 32 by this magnetic field, thus feeding power in a contactless state. Feeding the driving power from the power-feeding wire 31 to the power-receiving unit 32 in a contactless manner thereby allows the article transport vehicle 3 to cause the travel units 8 to travel, to raise and lower the grip unit 9, and the like, by this driving power.

The article transport vehicle 3 serving as the article transport device according to the present invention is used in order to transport a reticle cassette 5 among a plurality of article processing units 1 inside a cleanroom. There is therefore a need to keep the reticle cassette 5 clean during the process in which the reticle cassette 5 is transported on the article transport vehicle 3, as well. In view of this, the article transport vehicle 3 according to the present invention is provided with a configuration for keeping the reticle cassette 5 clean while being transported as well.

The following is a description of the configuration for keeping the reticle cassette 5 clean in the article transport vehicle 3 according to the present invention.

The article transport vehicle 3 transports articles among a plurality of article processing units 1 by causing the travel units 8 to travel in a state in which the grip unit 9 is located in the raised position. In view of this, in the article transport vehicle 3 according to the present invention, the reticle cassette 5 gripped by the grip unit 9 located in the raised position is to be kept clean. As illustrated in FIGS. 2 and 3, a housing space K for housing the reticle cassette 5 gripped by the grip unit 9 located in the raised position is formed in the vehicle main body 7 of the article transport vehicle 3. Further, purified air ventilation means 26 for ventilating purified air in this housing space K through an air purification filter is provided, the reticle cassette 5 being configured so as to be kept clean by filling the housing space K with purified air ventilated in by this purified air ventilation means 26.

The housing space K will be further described.

As illustrated in FIG. 3, the vehicle main body 7 has a front-end portion 7a, an intermediate portion 7b, and a rear-end portion 7c, as described above. The front-end portion 7a and the rear-end portion 7c are each provided with a wail extending along the lateral width direction and the up-down direction, and the intermediate portion 7b is provided with a wall extending along the lateral width direction and the front-rear direction. The grip unit 9 located at the raised position, and the reticle cassette 5 gripped by the grip unit 9 are covered on the front side thereof by the front-end portion 7a, are covered by the rear-end portion 7c on the rear side thereof, and are covered by the intermediate portion 7b on the upper side thereof. The grip unit 9 located at the raised position and the reticle cassette 5 gripped by the grip unit 9, in order for both sides of the lateral width direction Y to be covered, are provided with plate-shaped links 24 for connecting together the ends in the lateral width direction Y of the front-end portion 7a and the rear-end portion 7c. These links 24 form walls extending along the front-rear direction and the up-down direction. The vehicle main body 7 further has bottom units 30 that are contiguous with the lower edge of the front-end portion 7a, the lower edge of the links 24, and the lower edge of the rear-end portion 7c, and that extend in the horizontal direction. These bottom units are constituted of contact units 30, described in greater detail below. The housing space K is thus formed in a rectangular cuboid shape enclosed by the front-end portion 7a, the intermediate portion 7b, the rear-end portion 7c, the links 24, and the bottom units 30.

Further, as illustrated in FIGS. 2 and 3, the housing space K is not a completely enclosed space, but rather the lower-end part of the housing space K (i.e., the bottom units 30) is provided with an aperture 25 for allowing the grip unit 9 to be raised and lowered between a raised position inside the housing space K and a lowered position located outside the housing space K. It is thereby possible to raise and lower the grip unit 9 between the raised position and the lowered position through the aperture 25.

The purified air ventilation means 26 will be described further.

A more detailed diagram has been omitted, but the purified air ventilation means 26 comprises a fan filter unit in which a blowing fan and an air purification filter are integrally provided. A chemical filter capable of removing, for example, ammonia, sulfur dioxide, and other substances is used as the air purification filter, and the selection of which filter to use can be made in accordance with the desired substance(s) to be removed. The front-end portion 7a and the rear-end portion 7c are each provided with one purified air ventilation means 26, the configuration being such that purified air is ventilated to the housing space K from both the front side and rear side of the article transport vehicle 3. That is, the purified air ventilation means 26 provided in the front-end portion 7a is configured so as to ventilate purified air from the front side of the article transport vehicle 3 to the rear side, and the purified air ventilation means 26 provided in the rear-end portion 7c is configured so as to ventilate purified air from the rear side of the article transport vehicle 3 to the front side. Regarding the positions in the up-down direction at which the purified air ventilation means 26 is disposed, for example, as illustrated in FIG. 3, the purified air ventilation means 26 is disposed downward from the reticle cassette 5 gripped by the grip unit 9 located in the raised position. That is, the purified air ventilation means 26 is disposed such that the top of the purified air ventilation means 26 is located downward from the bottom of the reticle cassette 5 gripped by the grip unit 9 located in the raised position. It is thereby possible to appropriately ventilate purified air to the outer surface of the lid body 5b of the reticle cassette 5 (the outer surface of the reticle cassette 5), not only making it possible to appropriately prevent dust from adhering to the outer surface of the lid body 5b, but also making it possible to appropriately prevent ammonia, sulfur dioxide, and other substances from adhering as well.

Because an aperture 25 for raising and lowering the grip unit 9 is formed in the housing space K as described above, even though purified air is ventilated in the housing space K from the purified air ventilation means 26, it is difficult to fill the housing space K with purified air. In view of this, in order to make the housing space K into an enclosed space when the grip unit 9 is located in the raised position, the article transport vehicle 3 according to the present invention is provided with an opening/closing element 27 capable of changing positions between an open position for opening the aperture 25 and a closed position for blocking the aperture 25.

The opening/closing element 27, as illustrated in FIG. 3, comprises a first opening/closing element 27a capable of pivoting around a first pivot axis 28a located in the vicinity of the aperture 25 on a portion of the bottom unit 30 extending to the rear from the lower edge of the front-end portion 7a, and a second opening/closing element 27b capable of pivoting around a second pivot axis 28b located in the vicinity of the aperture 25 on a portion of the bottom unit 30 extending to the front from the lower edge of the rear-end portion 7c. Each of the first pivot axis 28a and second pivot axis 28b extends in the lateral width direction.

Further, the first opening/closing element 27a and the second opening/closing element 27b are configured so as to be capable of pivoting to the side away from each other to change positions to the open position (depicted by the dotted line in FIG. 3), and so as to be capable of pivoting to the side approaching each other to change positions to the closed position (depicted by the solid line in FIG. 3) in which the tip of the first opening/closing element 27a and the tip of the second opening/closing element 27b are in contact. The first pivot axis 28a and the second pivot axis 28b are provided so as to be able to be rotatably driven by a drive motor or other drive means (not shown), the configuration being such that the drive means rotatably drives the first pivot axis 28a and the second pivot axis 28b to allow the first opening/closing element 27a and the second opening/closing element 27b to pivot.

Both the first opening/closing element 27a and the second opening/closing element 27b take on a horizontal orientation along the front-rear direction of the article transport vehicle 3 in a case in which the first opening/closing element 27a and the second opening/closing element 27b are located in the closed position, and the aperture 25 is blocked.

In a case in which the first opening/closing element 27a and the second opening/closing element 27b are located in the open position, the first opening/closing element 27a takes on an erect orientation along the up-down direction in a state opposite the front-end portion 7a of the vehicle main body 7; the second opening/closing element 27b takes on an erect orientation along the up-down direction in a state opposite the rear-end portion 7c of the vehicle main body 7; the first opening/closing element 27a and the second opening/closing element 27b are housed in the housing space K; and the aperture 25 is opened.

The opening/closing element 27 thus comprises the two opening/closing elements 27a, 27b, and is configured so as to be able to change positions between an open position and a closed position by pivoting these two opening/closing elements 27a, 27b around a lateral axis (horizontal axis) along the lateral width direction of the vehicle body of the article transport vehicle 3. Further, the open position of the opening/closing element 27 depicted by the dotted line in FIG. 3 is set in the housing space K upward from the closed position depicted by the solid line in FIG. 3.

Both the first opening/closing element 27a and the second opening/closing element 27b are formed in a plate shape, and are configured such that the total surface area of the two opening/closing elements 27a, 27b located in the closed position is substantially the same as the open surface area of the aperture 25. The configuration is thereby such that the tip of the pivot side of the first opening/closing element 27a and the tip of the pivot side of the second opening/closing element 27b are in contact in an opposite-facing state, blocking the aperture 25, in a case in which the first opening/closing element 27a and the second opening/closing element 27b are located in the closed position.

Figure 4A:
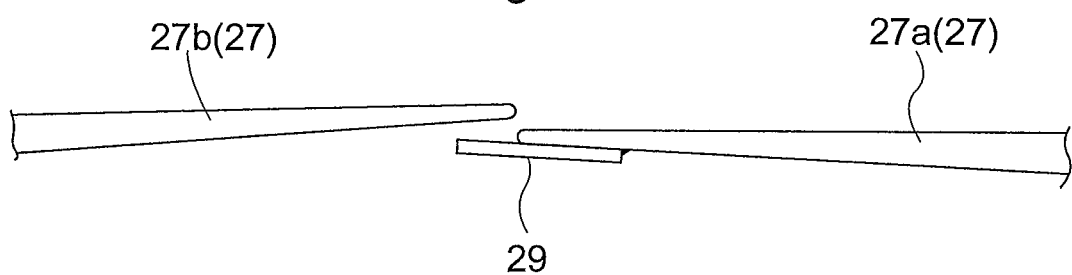
FIG. 4 is a view depicting the essential parts of the opening/closing element.

Further, as illustrated in FIG. 4, the tip part of the pivot side of the first opening/closing element 27a is provided with a contact unit 29 between opening/closing elements in contact with the tip part of the pivot side of the second opening/closing element 27b located in the closed position in a state in which the first opening/closing element 27a is located in the closed position. This contact unit 29 between opening/closing elements is mounted on the bottom surface part of the first opening/closing element 27a located in the closed position, and is constituted of a plate-shaped body extending frontward from the tip of the pivot side of the first opening/closing element 27a.

Figure 4B:
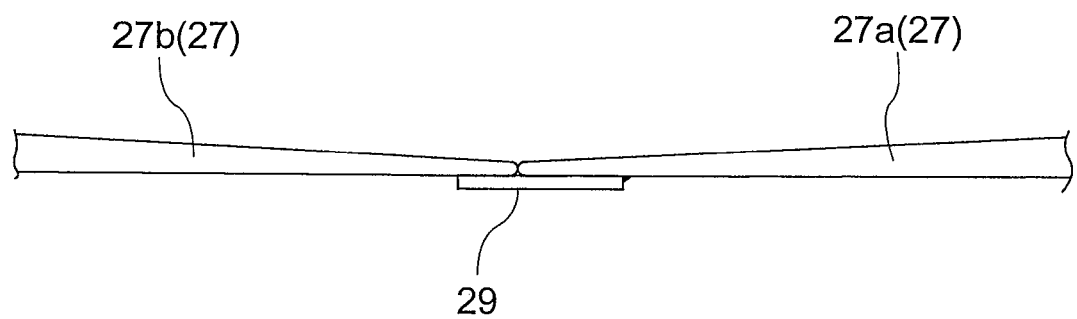

As illustrated in FIG. 4B, the configuration is thereby such that the second opening/closing element 27b is caught and supported in a state in which the upper surface part of the contact unit 29 between opening/closing elements is in contact with the bottom surface part of the second opening/closing element 27b in a case in which the first opening/closing element 27a and the second opening/closing element 27b are located in the closed position. Accordingly, in a case in which the first opening/closing element 27a and the second opening/closing element 27b are located in the closed position, not only are the tip of the first opening/closing element 27a and the tip of the second opening/closing element 27b in contact, but there is also contact between the second opening/closing element 27b and the contact unit 29 between the opening/closing elements provided to the first opening/closing element 27a. Therefore, the aperture 25 can be blocked while a gap between the first opening/closing element 27a and the second opening/closing element 27b can be reliably eliminated, and the housing space K can reliably be made into an enclosed space.

Herein, the tip part of the pivot side of the first opening/closing element 27a is provided with the contact unit 29 between the opening/closing elements. Therefore, in a case in which the position of the opening/closing element 27 is changed from the closed position to the open position, first the second opening/closing element 27b begins to change position from the closed position to the open position, and thereafter the first opening/closing element 27a begins to change position from the closed position to the open position. In a case in which the position of the opening/closing element 27 is changed from the open position to the closed position, first the first opening/closing element 27a begins to change position from the open position to the closed position, and thereafter the second opening/closing element 27b begins to change position from the open position to the closed position.

To eliminate a gap between the vehicle main body 7 and the opening/closing element 27, as illustrated in FIG. 2, the bottom unit 30 forms a vehicle body contact unit 30 (corresponding to a moving body contact unit) for contact with the opening/closing element 27 located in the closed position. The vehicle body contact unit 30 is constituted of a plate-shaped body extending in the housing space K from the lower-end unit of the links 24, and is provided in the aperture 25 over the entire length of the front-rear direction of the article transport vehicle 3.

Each link 24 for covering the housing space K on both sides in the lateral width direction of the article transport vehicle 3 is provided with exhaust means H capable of discharging air in the housing space K to the outside of the housing space K, and capable of adjusting the discharge rate. The exhaust means H comprises a porous body having numerous holes provided in an aperture formed in the links 24, and is configured so as to be able to adjust the rate at which air is discharged from the housing space K to the outside of the housing space K by adjusting the open surface area based on the numerous holes.

The manner in which the open surface area based on the numerous holes in the porous body is adjusted will be described.

Though omitted in the diagrams, for example, two porous bodies are provided in an overlapping state so as to be capable of sliding in the front-rear direction of the article transport vehicle 3, and an opening for communicating the inside and outside of the housing space K is formed by positioning the holes of one porous body and the holes of the other porous body in the same position. Further, the open surface area based on the numerous holes is configured so as to be adjustable by slidably moving the porous bodies using a human-operated operation unit to stagger the holes of one porous body relative to the holes of the other porous body.

A part of the purified air ventilated in the housing space K by the purified air ventilation means 26 can thereby be discharged to the outside of the housing space K with the exhaust means H, and therefore the housing space K can be filled with purified air while a part of the air in the housing space K is being replaced with purified air freshly ventilated by the purified air ventilation means 26. Further, by adjusting the rate at which air is discharged from the exhaust means H, a part of the air in the housing space K can reliably be replaced with purified air freshly ventilated by the purified air ventilation means 26, and the cleanliness in the housing space K can be successfully improved.

Herein, the rate at which air is discharged by the exhaust means H can be adjusted, for example, depending on the type of chemical filter used in the purified air ventilation means 26, and can be kept at a level at which a suitable air discharge rate is maintained for the type of chemical filter used. Once the air discharge rate is adjusted, the discharge rate is maintained until the chemical filter is replaced.

The following is a description of the operation of the article transport vehicle 3 according to the present invention.

The article transport vehicle 3 is provided with a carriage control unit for controlling the travel operation of the travel units 8, the raising and lowering operation of the grip unit 9, the orientation switching operation of the grip tools 22, and the like to control the operation of the article transport vehicle 3. Further, when a transport instruction designating a station 17 that is a transport origin and a station 17 that is a transport destination is received from a facility management computer for managing the operation of the article transport vehicle 3, the carriage control unit is configured so as to transport the reticle cassette 5 from the transport-origin station 17 to the transport-destination station 17 designated by this transport instruction. The various control units, control means, computers, or other members having control functions recited in this specification comprise CPUs, memory, or communication units, and the algorithms for executing the functions recited in this specification are stored in memory.

The carriage control unit controls the travel operation of the travel units 8 so that the units travel to the designated transport-origin station 17 on the basis of detection information from a variety of sensors such as a sensor for detecting the target stop position corresponding to each station 17, or a sensor for detecting the travel distance of the article transport vehicle 3 from a reference point. Thereafter, as illustrated on one side of FIG. 1, the carriage control unit controls the raising and lowering operation of the grip unit 9 and the orientation switching operation of the grip tools 22 so as to receive the reticle cassette 5 from the transport-origin station 17. When the reticle cassette 5 is received from the transport-origin station 17, the carriage control unit controls the travel operation of the travel units 8 so as to travel to the designated transport-origin station 17 on the basis of the detection information of the variety sensors, and then, as illustrated on the other side of FIG. 1, controls the raising and lowering operation of the grip unit 9 and the orientation switching operation of the grip tools 22 so as to deliver the reticle cassette 5 to the transport-destination station 17.

The carriage control unit not only controls the travel operation of the travel units 8, the raising and lowering operation of the grip unit 9, and the orientation switching operation of the grip tools 22, but also controls the opening and closing operation of the opening/closing element 27 and the operation of the purified air ventilation means 26. The carriage control unit continuously operates the purified air ventilation means 26 such that purified air is constantly ventilated in the housing space K. Further, the carriage control unit (corresponding to opening and closing control means) is configured, in a case in which the grip unit 9 is raised and lowered between the raised position and the lowered position, so as to position the opening/closing element 27 at the open position, and to control the opening and closing operation of the opening/closing element 27 such that the position of the opening/closing element 27 is changed from the open position to the closed position when the raising and lowering of the grip unit 9 between the raised position and the lowered position is completed. A sequence is set here as to whether the first opening/closing element 27*a* or the second opening/closing element 27*b* begins operation in a case in which the opening/closing element 27 is opened and closed, as described above. In a case in which the position of the opening/closing element 27 is changed from the closed position to the open position, first the second opening/closing element 27*b* begins to change position from the closed position to the open position, and thereafter the first opening/closing element 27*a* begins to change position from the closed position to the open position. In a case in which the position of the opening/closing element 27 is changed from the open position to the closed position, first the first opening/closing element 27*a* begins to change position from the open position to the closed position, and thereafter the second opening/closing element 27*b* begins to change position from the open position to the closed position.

The carriage control unit positions the opening/closing element 27 at the open position only when the grip unit 9 is raised and lowered between the raised position and the lowered position, and, when the raising and lowering of the grip unit 9 is completed, changes the position of the opening/closing element 27 from the open position to the closed position, with the opening/closing element 27 being positioned at the closed position at times other than when the grip unit 9 is raised and lowered. Further, the carriage control unit continuously operates the purified air ventilation means 26, and therefore the housing space K can be made into an enclosed space, and a part of the air in the housing space K can be replaced with purified air freshly ventilated by the purified air ventilation means 26 while the housing space K is filled with purified air not only when the unit travels to the transport-origin station 17, but also when the unit travels from the transport-origin station 17 to the transport-destination station 17. The housing space K can thereby be filled with purified air in advance, before the reticle cassette 5 is received from the transport-origin station 17 and while the reticle cassette 5 is not actually present in the housing space K. The housing space K can also be filled with purified air while the unit travels from the transport-origin station 17 to the transport-destination station 17 and while the reticle cassette 5 is actually present in the housing space K. As a result, dust as well as ammonia, sulfur dioxide, and other substances can be appropriately prevented from adhering to the outer surface of the reticle cassette being transported to the transport-destination station 17. Accordingly, as illustrated in FIG. 1, the part (for example, the lid body 5b) of the reticle cassette 5 whose outer surface is covered with dust, as well as ammonia, sulfur dioxide, and other substances, can be appropriately prevented from being transported into the article processing unit 1 in a case in which the reticle 4 is transported to the article processing unit 1 not by itself but together with the part of the reticle cassette 5 that supports the reticle 4 (for example, the lid body 5b). As a result, even when lithographic exposure or other processes are being performed in the article processing unit 1, substances that cause haze (cloudiness) can be appropriately prevented from being generated, and the quality of the reticle 4 can be maintained while the reticle 4 is being appropriately transported.

Other Embodiments (1) In the embodiment described above, the first opening/closing element 27a and the second opening/closing element 27b are provided so as to be able to pivot around a lateral axis (horizontal axis) along the lateral width direction of the article transport vehicle 3. Instead of this configuration, for example, the first opening/closing element 27a and the second opening/closing element 27b can also be provided so as to able to pivot around a lateral axis (horizontal axis) extending along the front-rear direction of the article transport vehicle 3.

There is also no limitation that the opening/closing element 27 be provided as the two opening/closing elements that are the first opening/closing element 27a and the second opening/closing element 27b, and, for example, the aperture 25 can also be blocked by a single opening/closing element.

(2) In the embodiment described above, the purified air ventilation means 26 is provided to both sides of the front-rear direction of the article transport vehicle 3. Instead of this configuration, for example, the purified air ventilation means 26 can also be provided to both sides in the lateral width direction of the article transport vehicle 3, and the position of the purified air ventilation means 26 can be appropriately changed. A single purified air ventilation means 26 can also be provided to the article transport vehicle 3.

(3) In the embodiment described above, the exhaust means H are provided to both sides in the lateral width direction of the article transport vehicle 3. In addition to or instead of this configuration, the exhaust means H can also be provided to the opening/closing element 27, and the position or number of the exhaust means H can be appropriately changed.

To adjust the rate at which air is discharged by the exhaust means H, the blocking body is moved using an operation by a human-operated operation unit, but, for example, a drive means can also be provided to move the blocking body using the drive power of this driving means.

(4) In the embodiment described above, the open position of the opening/closing element 27 is set upward from the closed position in the housing space K. Instead of this configuration, for example, the open position of the opening/closing element 27 can also be set downward from the closed position of the outside of the housing space K.

What is claimed is:

1. An article transport device, comprising:
    a moving body configured so as to move along a guide rail on a ceiling;
    an article-retaining unit provided to the moving body, configured so as to be raised and lowered to a raised position located close to the moving body and to a lowered position downward from the raised position, and configured so as to retain an article;
    a housing space for housing an article retained by the article-retaining unit located at the raised position being formed in the moving body, and an aperture for allowing the article-retaining unit to be raised and lowered between the raised position and the lowered position being formed in a bottom part region of the housing space;
    purified air ventilation means for ventilating purified air into the housing space through an air purification filter;
    an opening/closing element configured to change positions to an open position for opening the aperture and a closed position for completely closing the aperture by pivoting around a horizontal axis such that the housing space is substantially enclosed in all directions when the opening/closing element is in the closed position; and
    an opening and closing control unit for positioning the opening/closing element at the open position in a case in which the article-retaining unit is to be raised and lowered between the raised position and the lowered position, and changing the position of the opening/closing element from the open position to the closed position when the raising and lowering of the article-retaining unit between the raised position and the lowered position is completed.

2. The article transport device according to claim 1, wherein:
    the opening/closing element is provided with a first opening/closing element configured so as to pivot around a pivot axis provided to a region at one end part of the aperture, and with a second opening/closing element configured so as to pivot around a pivot axis provided to the other end part of the aperture;
    the opening/closing element being configured such that the first opening/closing element and the second opening/closing element pivot to the side away from each other to change positions to the open position, and that the first opening/closing element and the second opening/closing element pivot to the side approaching each other to change positions to the closed position in which the tip of the first opening/closing element and the tip of the second opening/closing element are in contact.

3. The article transport device according to claim 2, wherein:
    the tip part of the first opening/closing element is provided with a contact unit between opening/closing elements in contact with the tip part of the second opening/closing element located in the closed position, in a state in which the first opening/closing element is located in the closed position.

4. The article transport device according to claim 1, provided with exhaust means for discharging air in the housing space to the outside of the housing space, and for adjusting the discharge rate thereof.

5. The article transport device according to claim 4, wherein:
    the open position is set within the housing space upward from the closed position.

6. The article transport device according to claim 1, wherein:
the moving body is provided with a moving body contact unit for contact with the opening/closing element located in the closed position.

7. The article transport device according to claim 1, wherein:
the article is a reticle cassette capable of housing a reticle in an enclosed space within the cassette.

8. The article transport device according to claim 2, wherein:
the moving body has a vehicle main body;
the vehicle main body has a front-end portion extending along an up-down direction and a lateral width direction, a rear-end portion being disposed so as to be spaced to the rear from the front-end portion and extending along the up-down direction and the lateral width direction, an intermediate portion extending along a front-rear direction and the lateral width direction between the front-end portion and the rear-end portion, and a pair of links extending along the front-rear direction and the up-down direction between the front-end portion and the rear-end portion; and
the housing space is formed by at least the front-end portion, the rear-end portion, the intermediate portion, and the pair of links.

9. The article transport device according to claim 8, wherein:
the vehicle main body has contact units contiguous with a lower edge of the front-end portion, a lower edge of the rear-end portion, and lower edges of each of the pair of links;
a pivot axis of a first opening/closing element and a pivot axis of a second opening/closing element are disposed on the contact units; and
the lower part of the housing space is closed by the contact units and by the first and second opening/closing elements in the closed position.

10. An article transport device, comprising:
a moving body configured so as to move along a guide rail suspended from a ceiling, the moving body having a front wall, a rear wall, a top wall, and a pair of lateral walls spaced apart in the lateral direction;
an article-retaining unit provided to the moving body, configured so as to be raised and lowered between a raised position located close to the moving body and a lowered position downward from the raised position, and configured so as to retain an article, the article-retaining unit at the raised position being housed within a housing space formed by at least the front wall, rear-wall, top wall, and pair of lateral walls of the moving body, and the housing space communicating with the outside of the moving body via an aperture formed in a bottom region of the moving body;
a fan provided to at least one of the front wall, rear wall, top wall, and pair of lateral walls of the moving body, and a filter disposed so as to purify air from the fan; and
at least one door provided to the bottom region of the moving body and configured so as to change position between an open position for opening the aperture and a closed position for completely closing the aperture such that the housing space is substantially enclosed in all directions when the at least one door is in the closed position.

11. The article transport device according to claim 10, wherein the at least one door changes position between the open position and the closed position by pivoting around at least a horizontal axis.

12. The article transport device according to claim 10, wherein:
the at least one door includes a first door configured so as to pivot around a first pivot axis provided to a region at one end part of the aperture and a second door configured so as to pivot around a second pivot axis provided to a region on the other end part of the aperture, the at least one door being configured such that the first door and the second door pivot in a direction away from each other to change positions to the open position, and that the first door and the second door pivot in a direction approaching each other to change positions to the closed position in which the tip of the first door and the tip of the second door are in contact.

13. The article transport device according to claim 12, wherein:
the tip part of the first door is provided with a first contact unit in contact with the tip part of the second door located in the closed position in a state in which the first door is located in the closed position.

14. The article transport device according to claim 10, further provided with an exhaust port capable of discharging air in the housing space to the outside of the housing space, and capable of adjusting the discharge rate thereof, the exhaust port being formed in at least one of the front wall, the rear wall, the top wall, and the pair of lateral walls.

15. The article transport device according to claim 10, wherein:
the at least one door in the open position is housed within the housing space, and the height of a tip of the at least one door in the open position is set above the height of the tip of the at least one door in the closed position.

16. The article transport device according to claim 10, wherein:
the moving body is provided with a second contact unit extending horizontally from the lower edges of the front wall, the rear wall, and the pair of lateral walls, the second contact unit being in contact with the at least one door located in the closed position.

17. The article transport device according to claim 10, wherein:
the article is a reticle cassette capable of housing a reticle in an enclosed space within the cassette.

* * * * *